US011855145B2

(12) United States Patent
Tsai et al.

(10) Patent No.: US 11,855,145 B2
(45) Date of Patent: Dec. 26, 2023

(54) SEMICONDUCTOR STRUCTURE

(71) Applicant: TAIWAN SEMICONDUCTOR MANUFACTURING COMPANY LTD., Hsinchu (TW)

(72) Inventors: Hsing-I Tsai, Hsinchu (TW); Fu-Huan Tsai, Kaohsiung (TW); Chia-Chung Chen, Keelung (TW); Hsiao-Chun Lee, Chiayi (TW); Chi-Feng Huang, Hsinchu County (TW); Cho-Ying Lu, Hsinchu (TW); Victor Chiang Liang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 1 day.

(21) Appl. No.: 17/463,507

(22) Filed: Aug. 31, 2021

(65) Prior Publication Data

US 2023/0067210 A1    Mar. 2, 2023

(51) Int. Cl.
*H01L 29/08*      (2006.01)
*H01L 29/423*     (2006.01)
(Continued)

(52) U.S. Cl.
CPC ...... *H01L 29/0847* (2013.01); *H01L 29/4238* (2013.01)

(58) Field of Classification Search
CPC . H01L 29/4238; H01L 27/0207; H01L 29/78; H01L 29/66659; H01L 29/7835;
(Continued)

(56) References Cited

U.S. PATENT DOCUMENTS 7,215,562 B2 * 5/2007 Sekine ................. G11C 11/412
                                                365/72
10,468,490 B2 * 11/2019 Huang ................. H01L 27/0207
2021/0218914 A1   7/2021 Mun

FOREIGN PATENT DOCUMENTS

TW          201946279 A    12/2019

OTHER PUBLICATIONS

Wang et al., "Shallow Trench Isolation Edge Effect on Random Telegraph Signal Noise and Implications for Flash Memory," in IEEE Transactions on Electron Devices, vol. 56, No. 9, pp. 2107-2113, Sep. 2009.

(Continued)

*Primary Examiner* — Sonya McCall-Shepard
(74) *Attorney, Agent, or Firm* — WPAT Law; Anthony King

(57) ABSTRACT

A semiconductor structure includes a gate structure, a source region, a drain region, and an isolation structure. The gate structure includes a first portion, a second portion and a third portion. The first portion extends in a first direction, and the second portion and the third portion extend in a second direction. The second portion and the third portion are disposed at opposite ends of the first portion. The source region and the drain region are separated by the gate structure. The isolation structure surrounds the gate structure, the source region and the drain region. The first portion has a first sidewall, the second portion has a second sidewall, and the third portion has a third sidewall. The first sidewall, the second sidewall and the third sidewall are parallel to the first direction and aligned with each other to form a straight line.

20 Claims, 11 Drawing Sheets

(51) Int. Cl.
  *H01L 27/02* (2006.01)
  *H01L 29/78* (2006.01)
  *H01L 21/8234* (2006.01)
(58) Field of Classification Search
  CPC ........... H01L 29/78624; H01L 29/0847; H01L 21/823481
  See application file for complete search history.

(56) References Cited

OTHER PUBLICATIONS

K. Abe et al., "Asymmetry of RTS characteristics along source-drain direction and statistical analysis of process-induced RTS," 2009 IEEE International Reliability Physics Symposium, Montreal, QC, 2009.

M. Seo et al. "A Low Dark Leakage Current High-Sensitivity CMOS Image Sensor With STI-Less Shared Pixel Design," in IEEE Transactions on Electron Devices, vol. 61, No. 6, pp. 2093-2097, Jun. 2014.

A. Yonezawa et al. "Statistical analysis of Random Telegraph Noise reduction effect by separating channel from the Interface," 2012 IEEE International Reliability Physics Symposium (IRPS), Anaheim, CA, 2012.

Lele Jiang et al. "Device parameter variations of n-MOSFETS with dog-bone layouts in 65nm and 40nm technologies," 2013 IEEE 10th International Conference on ASIC, Shenzhen, 2013, pp. 1-3.

Ichino, Shinya et al. "Statistical Analyses of Random Telegraph Noise in Pixel Source Follower with Various Gate Shapes in CMOS Image Sensor."

U.S. Pat. No. 10,510,835 B2 is the US counterpart of TW 201946279.

* cited by examiner

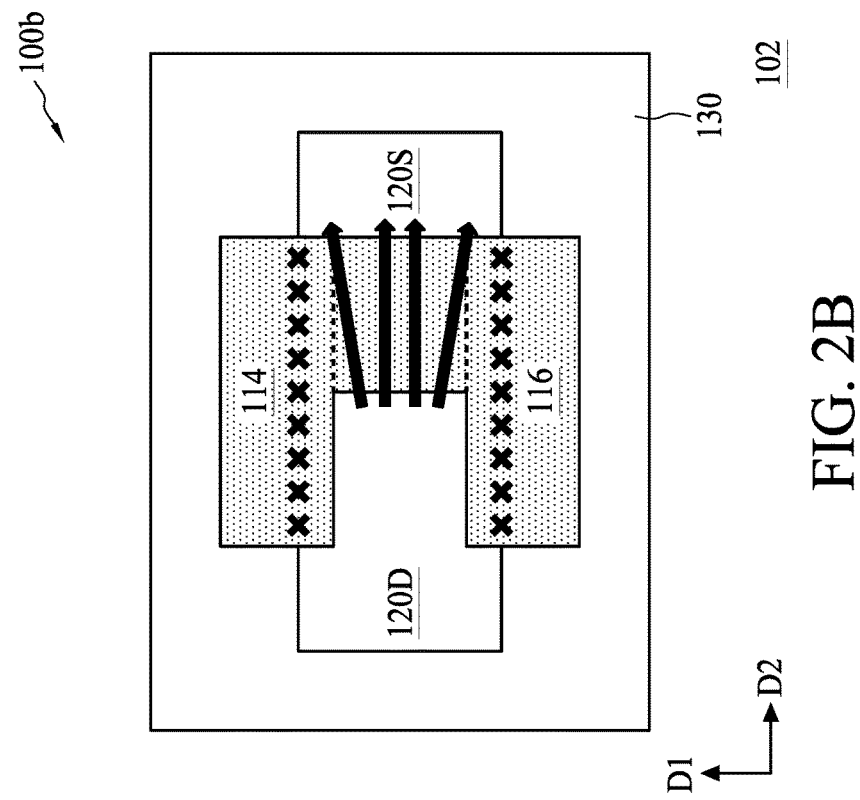
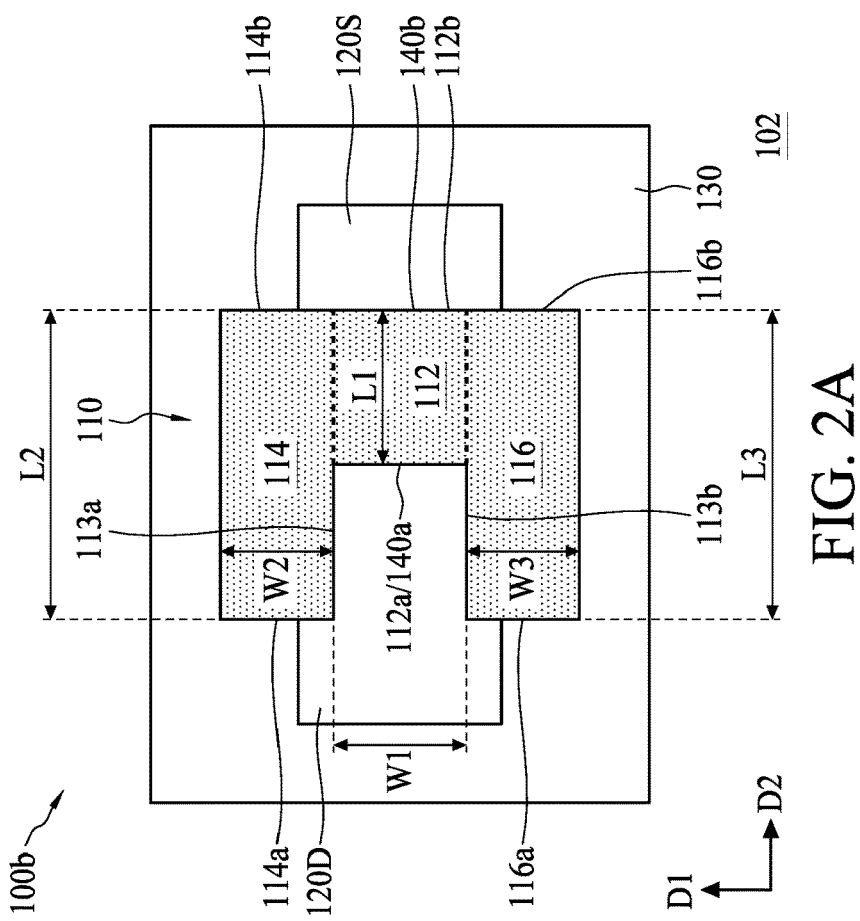
FIG. 2B
FIG. 2A

SEMICONDUCTOR STRUCTURE

BACKGROUND

Semiconductor devices are used in a variety of electronic applications, such as personal computers, cellular telephones, digital cameras, and other electronic equipment. The semiconductor industry continues to improve the integration density of various electronic components (e.g., transistors, diodes, resistors, capacitors, etc.) by making continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a schematic drawing illustrating a top view of a semiconductor structure according to aspects of the present disclosure in one or more embodiments.

FIG. 2B is a schematic drawing illustrating a top view of the semiconductor structure of FIG. 2A in operation according to aspects of the present disclosure in one or more embodiments.

DETAILED DESCRIPTION

Figure 1B:
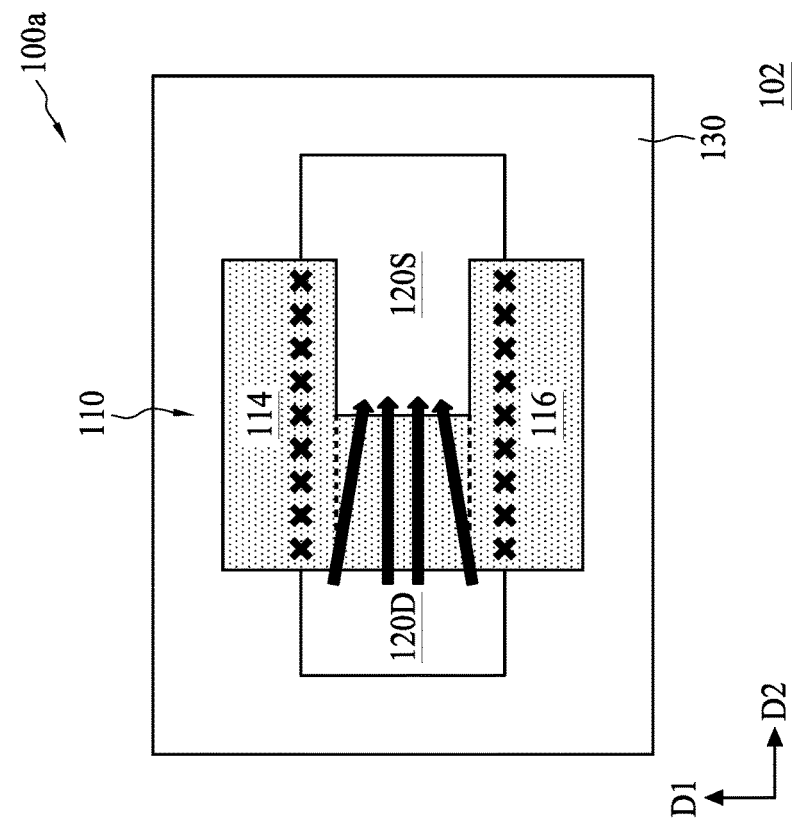
FIG. 1B is a schematic drawing illustrating a top view of the semiconductor structure of FIG. 1A in operation according to aspects of the present disclosure in one or more embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially." "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially." "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Random telegraph signal (RTS) noise, which is a stochastic fluctuation in drain current ($I_D$) or threshold voltage (Vt), is one type of low frequency noise which occurs in MOSFET devices. RTS noise may reduce the minimum operation voltage (Vccmin) of mobile CPUs and decrease signal-to-noise ratio in analog or digital converters in deep-submicrometer MOSFET-based technology. Recently, RTS noise has become recognized as one of the most important issues in efforts to achieve high resolution and high sensitivity in CMOS image sensors (CIS). RTS noise has also become a major concern in the field of flash memory. Further, RTS noise occurs more frequently and seriously in smaller gate area MOSFETs. The magnitude of RTS noise cannot be ignored as the downscaling of the CMOS devices continues. For example, reducing RTS noise in MOSFET devices is a key factor to improving performance in lower power analog platform and CIS platform.

Studies of MOSFET devices have shown that RTS noise is correlated to the presence of trapping sites at an interface between an isolation structure (i.e., a shallow trench isolation (STI) structure) and the MOSFET devices. It is also found that the trapping sites in a source side of a MOSFET device impacts RTS noise more than those in a drain side of the MOSFET device. In some comparative approaches, it is concluded that the trapping sites at the interface between the STI and the MOSFET device and the trapping sites on the source side of the MOSFET device significantly affect the RTS phenomenon.

The present disclosure therefore provides a semiconductor structure to mitigate the RTS noise issue without violating design rule checking (DRC) and without requiring changes to manufacturing operations. In some embodiments, the provided semiconductor structure includes a transistor having a C-shaped gate structure. In such embodiments, currents are confined by the C-shaped gate structure, and thus less current passes through the trapping sites at the interface between the STI and the MOSFET device. In some embodiments, the provided semiconductor structure includes a transistor including asymmetric source/drain regions. In such embodiments, current density on the source side is increased to suppress the trapping sites in the source region. Accordingly, the RTS noise issue is mitigated.

Figure 1A:
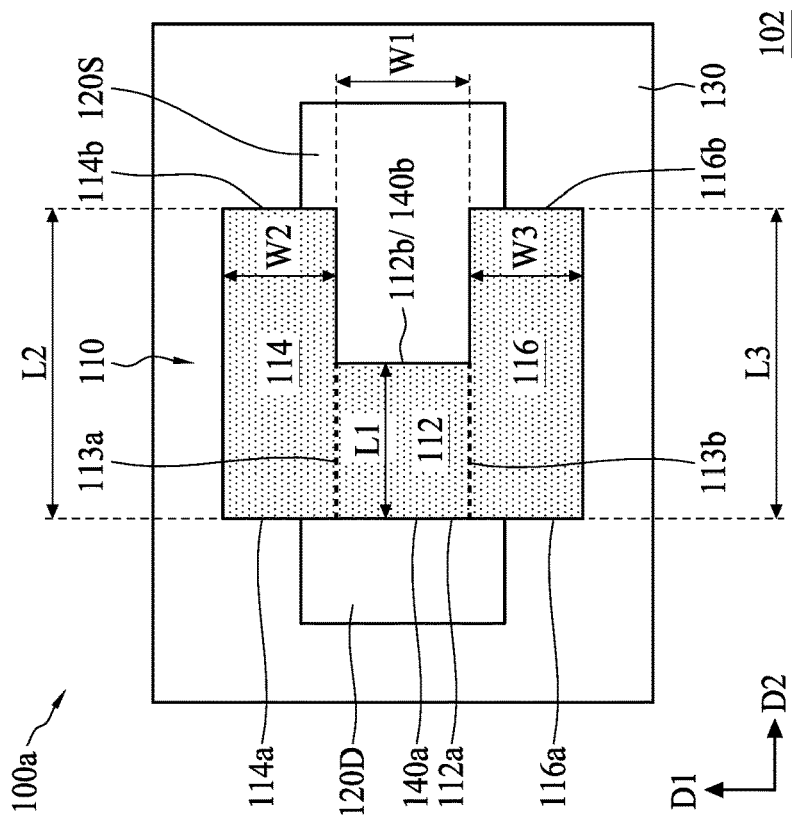
FIG. 1A is a schematic drawing illustrating a top view of a semiconductor structure according to aspects of the present disclosure in one or more embodiments.

FIGS. 1A and 2A are schematic drawings illustrating top views of semiconductor structures 100a and 100b according to aspects of the present disclosure in one or more embodiments. FIG. 1B is a schematic drawing illustrating a top view of the semiconductor structure 100a in operation, and FIG. 2B is a schematic drawing illustrating a top view of the semiconductor structure 100b in operation. In some embodiments, FIGS. 1A to 2B may be referred to as schematic drawings illustrating layout structures, respectively. It should be noted that same elements in FIGS. 1A to 2B are indicated by same numerals, and may include a same material. In some embodiments, the semiconductor structures 100a and 100b may be disposed in and over a semiconductor substrate 102. The semiconductor structures 100a and 100b respectively include a gate structure 110, a source region 120S, a drain region 120D and an isolation structure 130. The gate structure 110, the source region 120S and the drain region 120D form a transistor device.

In some embodiments, the gate structure 110 includes a first portion 112, a second portion 114 and a third portion 116 from a top view. As shown in FIGS. 1A and 2A, the first portion 112 extends in a first direction D1, while the second portion 114 and the third portion 116 extend in a second direction D2. The second direction D2 is different from the first direction D1. In some embodiments, the first direction D1 is perpendicular to the second direction D2, but the disclosure is not limited thereto. In some embodiments, the first portion 112 has a first end 113a and a second end 113b opposite to the first end 113a. In such embodiments, the second portion 114 is disposed at the first end 113a, and the third portion 116 is disposed at the second end 113b. The first portion 112 has a sidewall 112a parallel to the first direction D1, the second portion 114 has a sidewall 114a parallel to the first direction D1, and the third portion 116 has a sidewall 116a parallel to the first direction D1. In some embodiments, the sidewall 112a of the first portion 112, the sidewall 114a of the second portion 114 and the sidewall 116a of the third portion face toward the drain region 120D, as shown in FIGS. 1A and 1B. Further, the sidewall 112a of the first portion 112, the sidewall 114a of the second portion 114 and the sidewall 116a of the third portion 116 are aligned with each other to form a straight line, as shown in FIGS. 1A and 1B. In some alternative embodiments, the first portion 112 has a sidewall 112b opposite to the sidewall 112a, the second portion 114 has a sidewall 114b opposite to the sidewall 114a, and the third portion 116 has a sidewall 116b opposite to the sidewall 116a. In some embodiments, the sidewall 112b of the first portion 112, the sidewall 114b of the second portion 114 and the sidewall 116b of the third portion face toward the source region 120S, as shown in FIG. 2A and 2B. Further, the sidewall 112b of the first portion 112, the sidewall 114b of the second portion 114 and the sidewall 116b of the third portion 116 are aligned with each other to form a straight line, as shown in FIGS. 2A and 2B.

In some embodiments, when the sidewalls 112a, 114a and 116a are aligned with each other, the sidewall 112b is offset (i.e., not aligned with) from the sidewalls 114b and 116b, as shown in FIGS. 1A and 1B. Alternatively, when the sidewalls 112b, 114b and 116b are aligned with each other, the sidewall 112a is offset (i.e., not aligned with) from the sidewalls 114a and 116a.

In some embodiments, each of the first portion 112, the second portion 114 and the third portion 116 has a rectangular shape. The first portion 112 has a length L1. In some embodiments, the length L1 of the first portion 112 is measured from the sidewall 112a to the sidewall 112b opposite to the sidewall 112a in the second direction D2. In some embodiments, the length L1 of the first portion 112 may be consistent. The second portion 114 has a length L2, and the third portion 116 has a length L3. The length L2 of the second portion 114 is measured from the sidewall 114a to the sidewall 114b opposite to the sidewall 114a in the second direction D2, and the length L3 of the third portion 116 is measured from the sidewall 116a to the sidewall 116b opposite to the sidewall 116a in the second direction D2. In some embodiments, the length L2 and the length L3 are both consistent. In some embodiments, the length L2 of the second portion 114 and the length L3 of the third portion 116 are substantially the same, but the disclosure is not limited thereto. The length L1 of the first portion 112 may be different from the length L2 of the second portion 114 and the length L3 of the third portion 116. In some embodiments, the length L1 of the first portion 112 is less than the length L2 of the second portion 114 and less than the length L3 of the third portion 116. In some embodiments, the length L2 of the second portion 114 and the length L1 of the first portion 112 have a ratio, and the ratio is between approximately 1.1 and approximately 3, but the disclosure is not limited thereto. In some embodiments, the length L3 of the third portion 116 and the length L1 of the first portion 112 have a ratio, and the ratio is between approximately 1.1 and approximately 3, but the disclosure is not limited thereto.

The first portion 112 has a width W1. In some embodiments, the width W1 of the first portion 112 is measured from the first end 113a to the second end 113b in the first direction D1. In some embodiments, the width W1 of the first portion 112 may be consistent. The second portion 114 has a width W2, and the third portion 116 has a width W3. In some embodiments, the width W2 of the second portion 114 and the width W3 of the third portion 116 are both measured in a direction parallel to the first direction D1. In some embodiments, the width W2 of the second portion 114 and the width W3 of the third portion 116 are both consistent. In some embodiments, the width W2 of the second portion 114 and the width W3 of the third portion 116 are substantially the same, but the disclosure is not limited thereto. In some embodiments, the width W2 of the second portion 114 and the width W1 of the first portion 112 have a ratio, and the ratio is between approximately 0.1 and approximately 3, but the disclosure is not limited thereto. In some embodiments, the width W3 of the third portion 116 and the width W1 of the first portion 112 have a ratio, and the ratio is between approximately 0.1 and approximately 3, but the disclosure is not limited thereto. In some embodiments, the width W1 of the first portion 112 is defined by a design rule of different technology nodes. In some embodiments, the width W1 of the first portion 112 may be a minimum design rule value. In some alternative embodiments, the width W1 of the first portion 112 may be a maximum design rule value.

The source region 120S and the drain region 120D are doped regions separated from each other by the gate structure 110. In some embodiments, a first interface 140a is between the gate structure 110 and the drain region 120D, and a second interface 140b is between the gate structure 110 and the source region 120S. A length of the first interface 140a is different from a length of the second interface 140b. In some embodiments, the first interface 140a includes the sidewall 112a of the first portion 112, a portion of the sidewall 114a of the second portion 114 and a portion of the sidewall 116a of the third portion 116. In such embodiments, the second interface 140b includes only the sidewall 112b of the first portion 112. In such embodiments, the length of the first interface 140a is greater than the length of the second interface 140b, as shown in FIGS. 1A and 1B. In some alternative embodiments, the first interface 140a includes only the first sidewall 112a of the first portion 112, while the second interface 140b includes the sidewall 112b of the first portion 112, a portion of sidewall 114b of the second portion 114 and a portion of the sidewall 116b of the third portion 116. In such embodiments, the length of the first interface 140a is less than the length of the second interface 140b, as shown in FIGS. 2A and 2B.

In some embodiments, the isolation structure 130 may be a shallow trench isolation (STI) structure, but the disclosure is not limited thereto. The isolation structure 130 surrounds the gate structure 110, the source region 120S and the drain region 120D. In some embodiments, each of the second portion 114 and the third portion 116 partially overlap the isolation structure 130. A region of the second portion 114 overlapping the isolation structure 130 and a region of the third portion 116 overlapping the isolation structure 130 may be similar, but the disclosure is not limited thereto.

Accordingly, the first portion 112, the second portion 114 and the third portion 116 form a C-shaped gate structure 110, as shown in FIGS. 1A and 2A. Further, the source region 120S and the drain region 120D are not symmetrical with each other.

As mentioned above, the trapping sites are often found at the interface between the isolation structure 130 and the semiconductor substrate 102. Referring to FIGS. 1B and 2B, in some embodiments, because the semiconductor structures 100a and 100b respectively have the C-shaped gate structure 110, currents are confined by the C-shaped gate structure 110 and pushed away from the interface between the isolation structure 130 and the semiconductor substrate 102. In other words, the currents are pushed away from the interface where the trapping sites are found. Consequently, RTS noise is mitigated.

Figure 3:
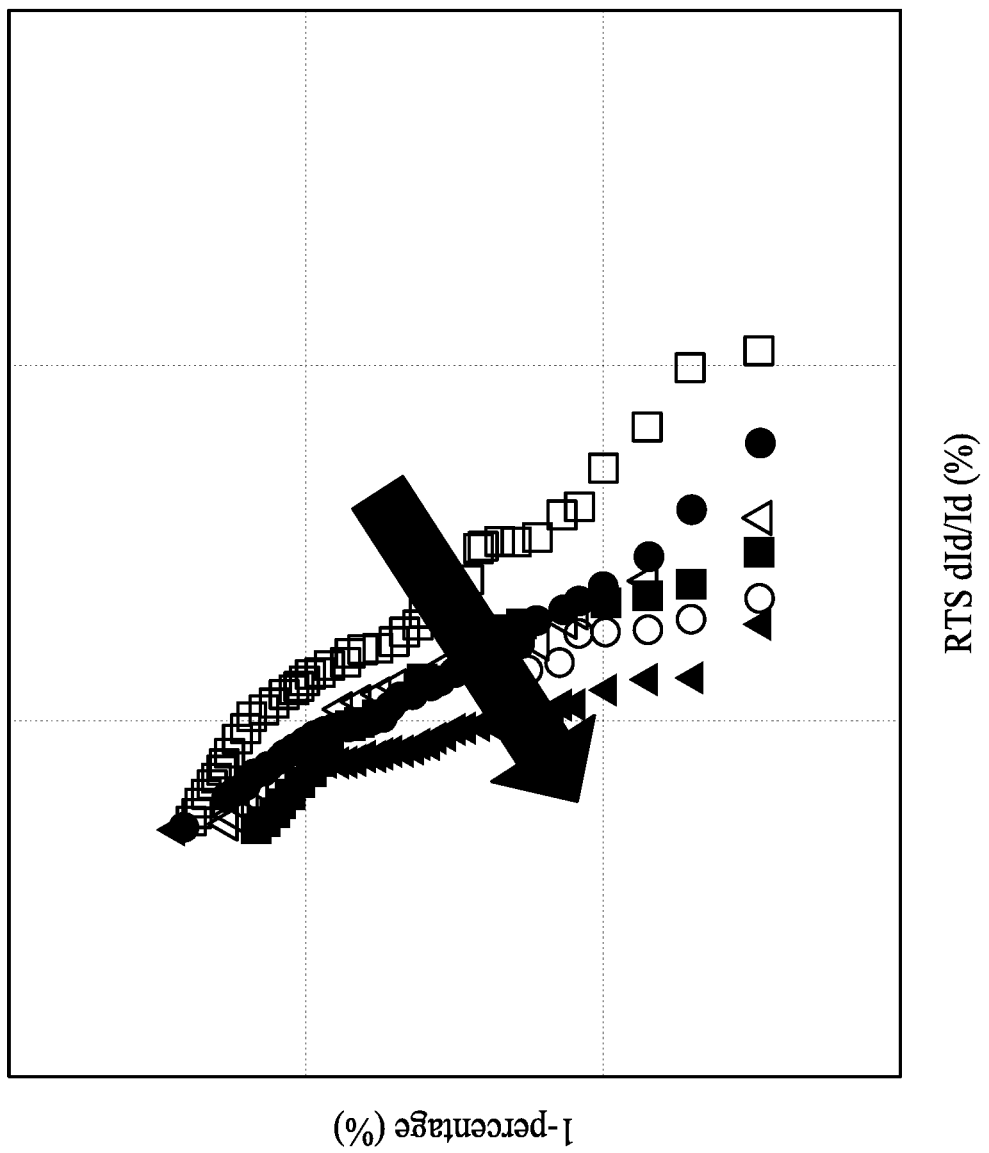
FIG. 3 is a chart showing an RTS bias trend according to aspects of the present disclosure in one or more embodiments.

Referring to FIG. 1B and FIG. 3, in some embodiments, although the same currents flow from the drain region 120D to the source region 120S, a current density is increased in the source region 120S due to the smaller length of the second interface 140b of the C-shaped gate structure 110. In some embodiments, an effective channel width of the semiconductor structure 100a on the drain side is different from that on the source side due to the C-shaped gate structure 110 and the asymmetric source/drain regions 120S/120D. Further, electrical fields are concentrated in the source region 120S. Thus, an overdrive voltage (Vov), which is calculated based on the gate-source voltage (Vgs) and the threshold voltage (Vth) as Vov=Vgs−Vth, is increased. Thus, current may pass through the trapping sites due to the increased overdrive voltage Vov. Consequently, the RTS noise issue in the source region 120S may be mitigated, as shown in FIG. 3.

Accordingly, the semiconductor structures 100a and 100b may efficiently mitigate the RTS noise issue. Further, dimensions of each of the first portion 112, the second portion 114 and the third portion 116 may be defined by the design rule of different technology nodes as mentioned above. Therefore, the semiconductor structures 100a and 100b help mitigate the RTS noise issue without violating design rule checking (DRC), and thus feasibility and practicality of the semiconductor structures 100a and 100b are improved.

FIGS. 4 to 7 are schematic drawings respectively illustrating top views of semiconductor structures 200a, 200b, 200c and 200d according to aspects of the present disclosure in one or more embodiments. In some embodiments, FIGS. 4 to 7 may be referred to as schematic drawings illustrating layout structures, respectively. It should be noted that same elements in FIGS. 1A to 7 are indicated by same numerals, and can include a same material; thus, repeated detailed descriptions of such elements are omitted for brevity.

Figure 4:
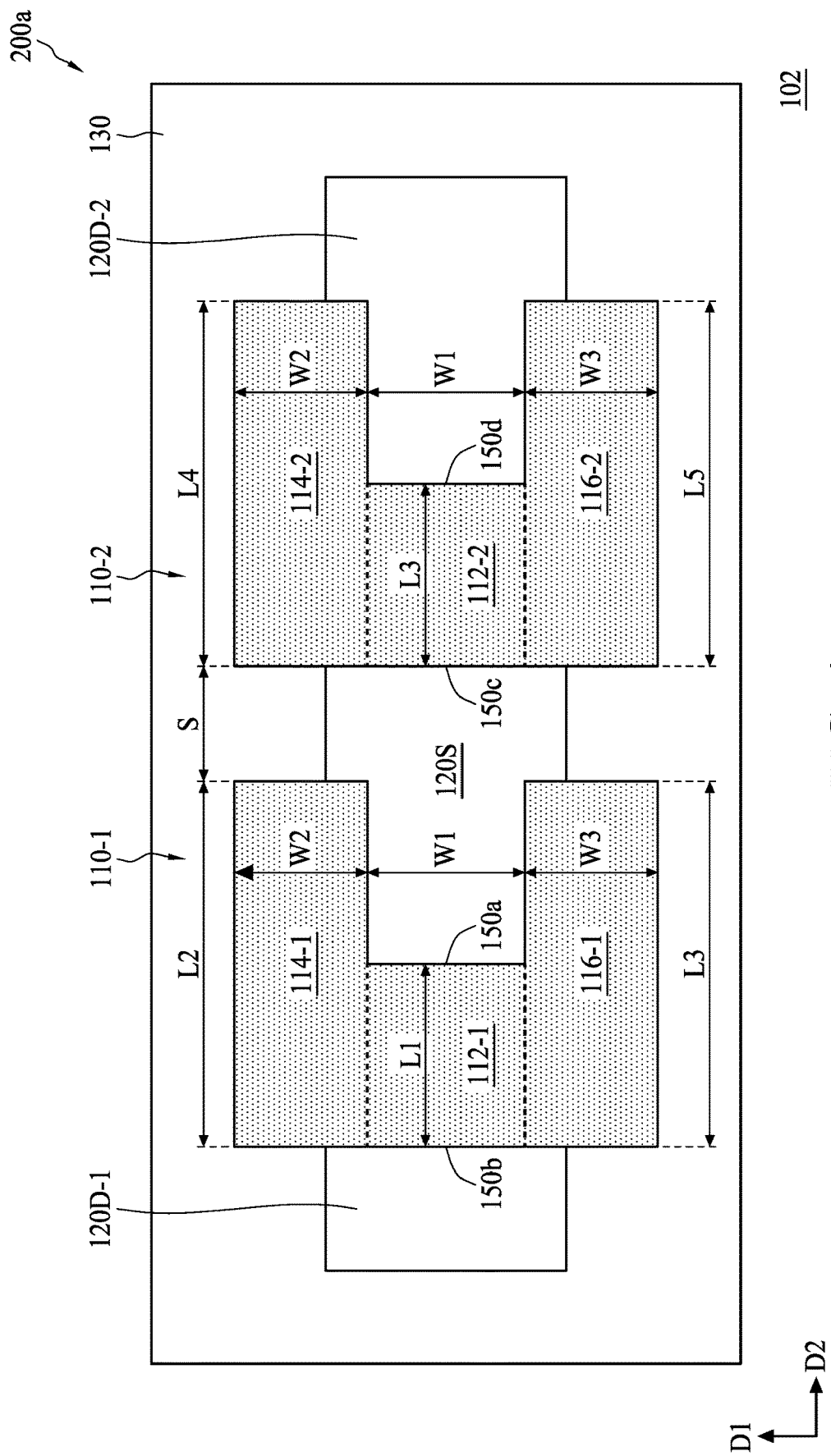
FIG. 4 is a schematic drawing illustrating a top view of a semiconductor structure according to aspects of the present disclosure in one or more embodiments.
Figure 5:
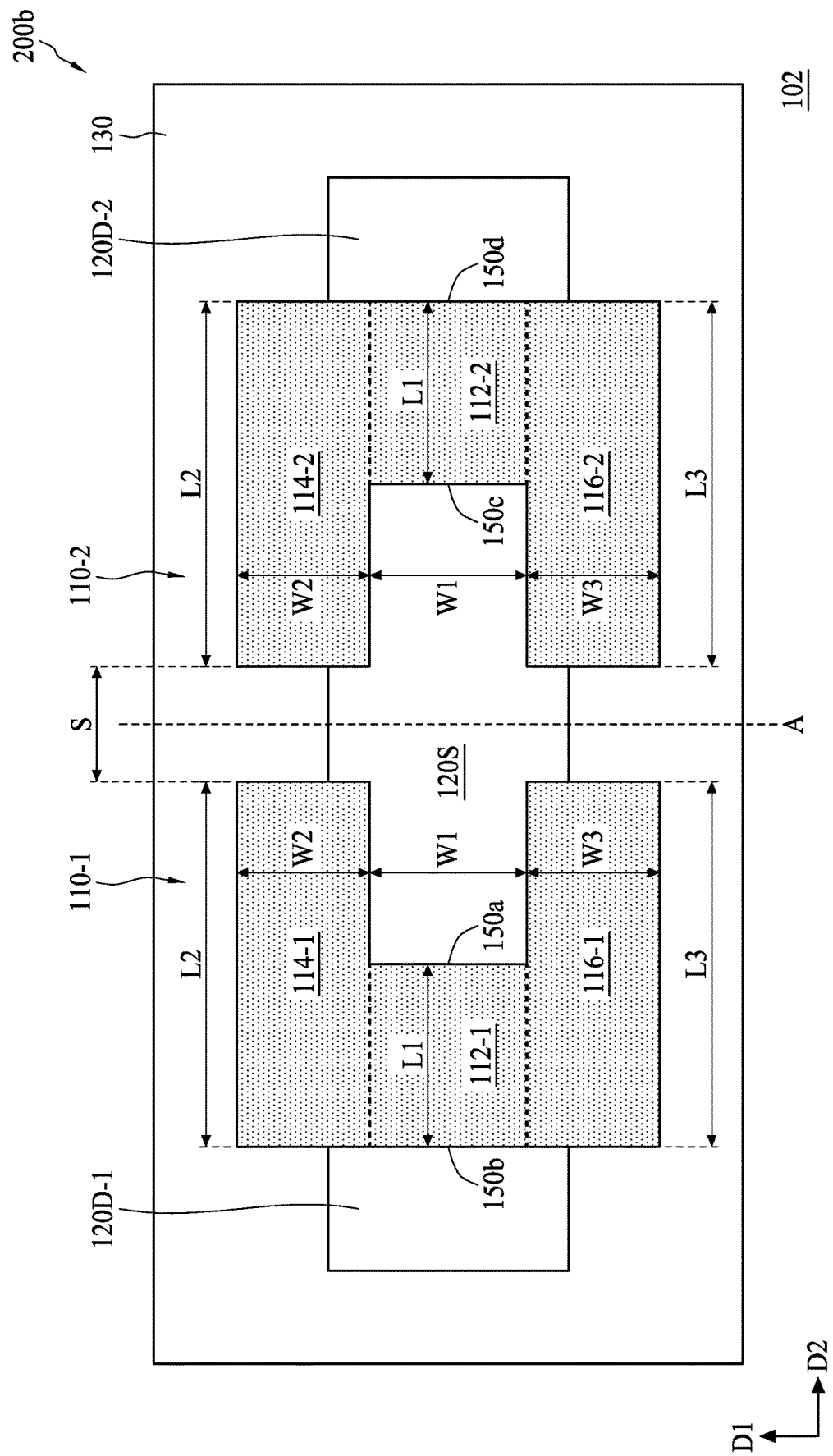
FIG. 5 is a schematic drawing illustrating a top view of a semiconductor structure according to aspects of the present disclosure in one or more embodiments.
Figure 6:
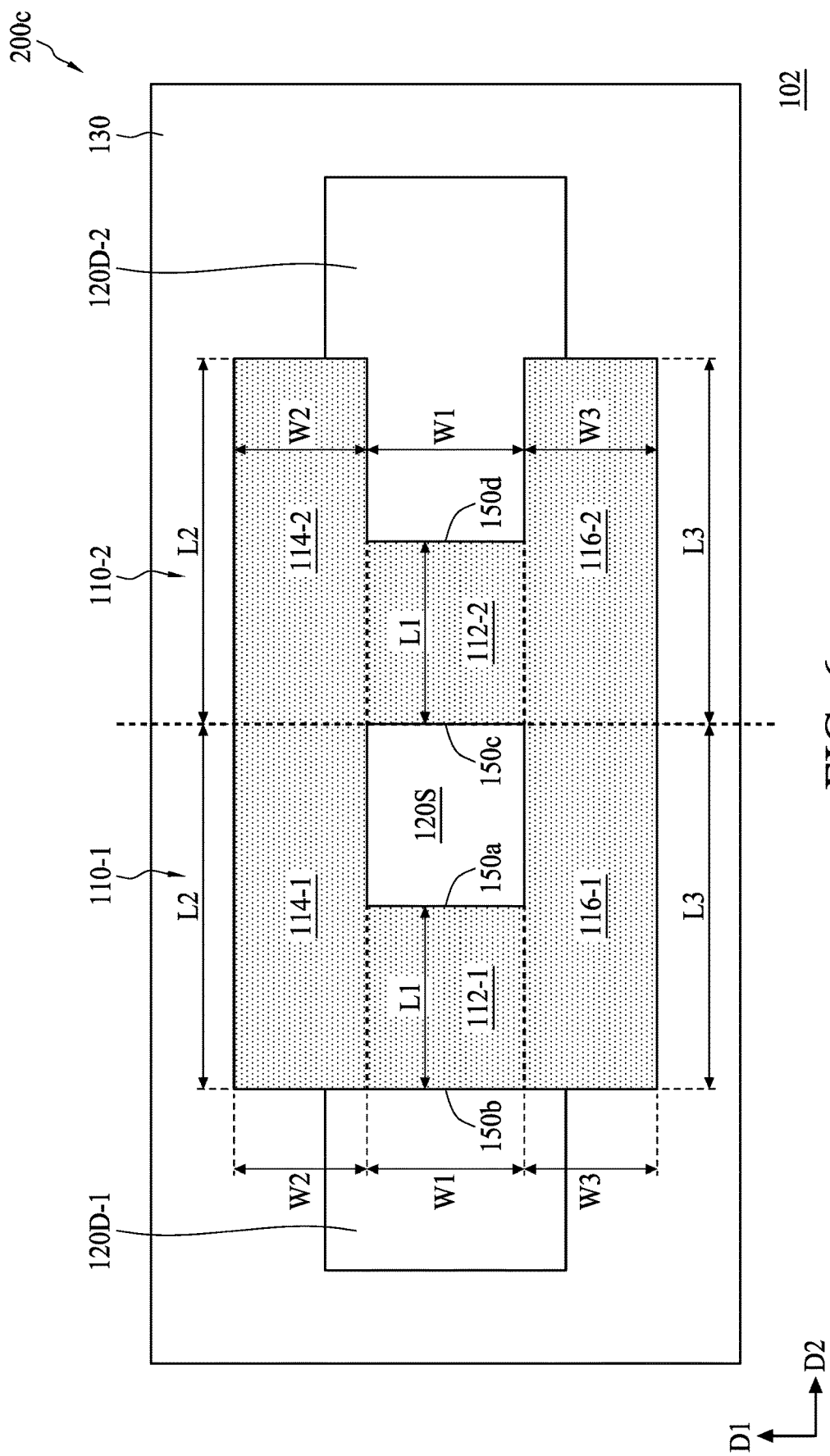
FIG. 6 is a schematic drawing illustrating a top view of a semiconductor structure according to aspects of the present disclosure in one or more embodiments.
Figure 7:
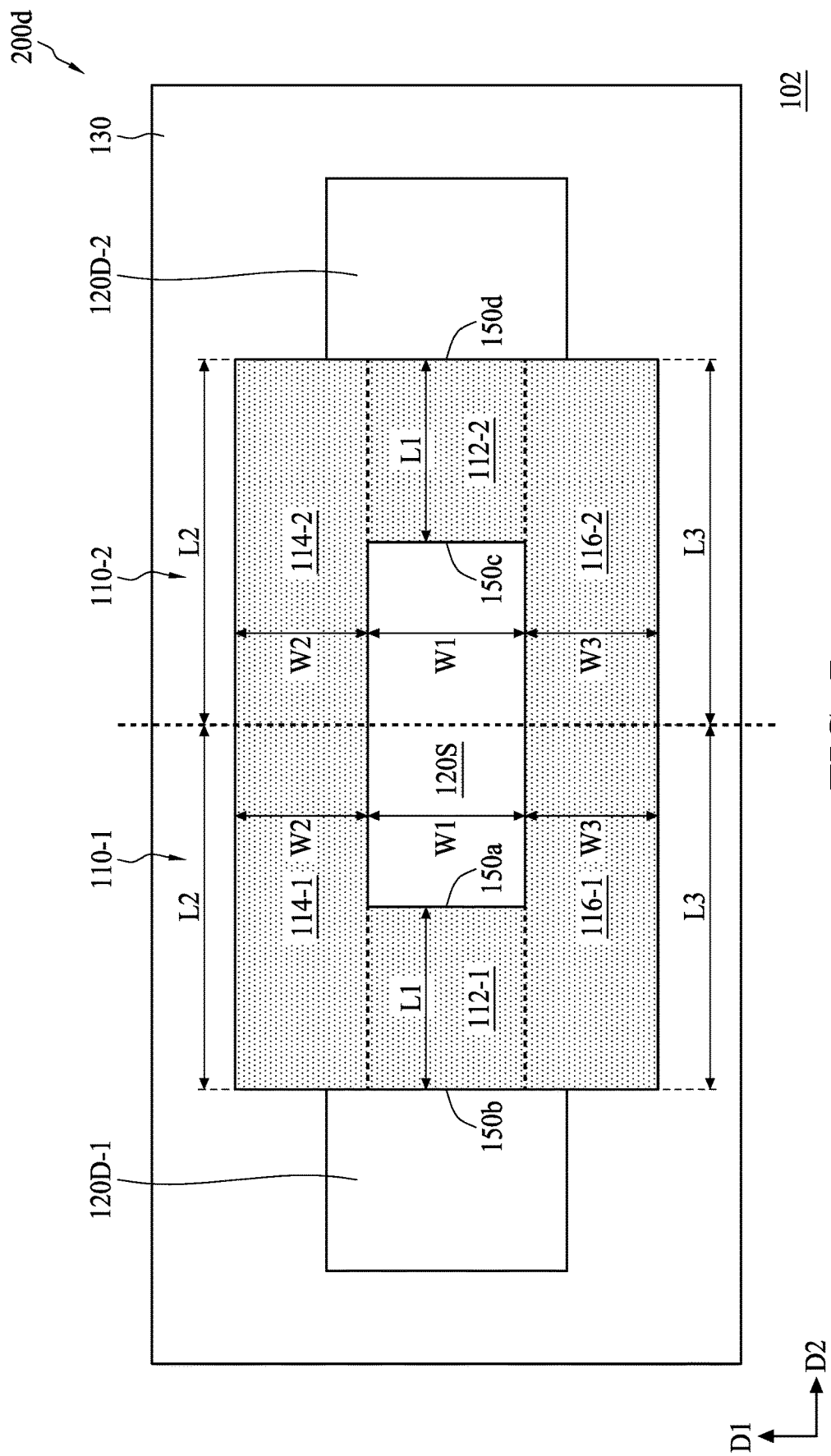
FIG. 7 is a schematic drawing illustrating a top view of a semiconductor structure according to aspects of the present disclosure in one or more embodiments.

Referring to FIGS. 4 to 7, in some embodiments, the gate structure 110 of the semiconductor structure 100a and the semiconductor structure 100b may be repeatedly disposed over a semiconductor substrate 102. In some embodiments, at least two gate structures 110 of the semiconductor structure 100a may be disposed over the semiconductor substrate 102, as shown in FIGS. 4 and 6. Further, the two gate structures 110 may share one source region 120S. In some embodiments, at least one gate structure 110 of the semiconductor structure 100a and at least one gate structure 110 of the semiconductor structure 100b may be disposed over the semiconductor substrate 102, as shown in FIGS. 5 and 7. Further, the two gate structures 110 may share one source region 120S. Thus, the semiconductor structures 200a to 200d may respectively include a first gate structure 110-1 and a second gate structure 110-2, as shown in FIGS. 4 to 7.

Further, the semiconductor structures 200a to 200d may include a plurality of doped regions 120S/120D, and an isolation structure 130.

The first gate structure 110-1 may include a first portion 112-1, a second portion 114-1 and a third portion 116-1. Dimensions and a relationship between the first portion 112-1, the second portion 114-1 and the third portion 116-1 may be similar to those of the gate structure 110 of the semiconductor structure 100a; thus, repeated detailed descriptions of such elements are omitted for brevity. The second gate structure 110-2 may include a fourth portion 112-2, a fifth portion 114-2 and a sixth portion 116-2. Dimensions of the fourth portion 112-2, the fifth portion 114-2 and the sixth portion 116-2 may be similar to those of the gate structure 110 of the semiconductor structure 100a or 100b; thus, repeated detailed descriptions of such elements are omitted for brevity. Referring to FIGS. 4 and 6, in some embodiments, a relationship between the fourth portion 112-2, the fifth portion 114-2 and the sixth portion 116-2 may be similar to that of the gate structure 110 of the semiconductor structure 100a; thus, repeated detailed descriptions of such elements are omitted for brevity. In such embodiments, the two gate structures 110-1 and 110-2 both include a C shape, as shown in FIGS. 4 and 6. Referring to FIGS. 5 and 7, in some alternative embodiments, a relationship between the fourth portion 112-2, the fifth portion 114-2 and the sixth portion 116-2 may be similar to that of the gate structure 110 of the semiconductor structure 100b; thus, repeated detailed descriptions of such elements are omitted for brevity. In such embodiments, the first gate structure 110-1 and the second gate structure 110-2 may be symmetrical about an axis A, as shown in FIGS. 5 and 7.

Referring to FIGS. 4 and 5, in some embodiments, the first gate structure 110-1 and the second gate structure 110-2 are separated from each other by a distance S. In some embodiments, the distance S between the first gate structure 110-1 and the second gate structure 110-2 may be equal to a minimum design rule. In some alternative embodiments, the distance S between the first gate structure 110-1 and the second gate structure 110-2 may be greater than the minimum design rule.

In some embodiments, one of the doped regions is disposed between the first gate structure 110-1 and the second gate structure 110-2, and serves as a source region 120S shared by the first gate structure 110-1 and the second gate structure 110-2. In such embodiments, doped regions that are separated from the source region 120S by the first gate structure 110-1 and the second gate structure 110-2 serve as drain regions 120D-1 and 120D-2, respectively. An interface 150a is between the first gate structure 110-1 and the source region 120S, and an interface 150b is between the first gate structure 110-1 and the drain region 120D-1. In some embodiments, the interface 150a is between the source region 120S and only a sidewall of the first portion 112-1 of the first gate structure 110-1, while the interface 150b is between the drain region 120D-1 and a portion of a sidewall of the second portion 114-1, a sidewall of the first portion 112-1 and a portion of a sidewall of the third portion 116-1. In some embodiments, a length of the interface 150a is less than a length of the interface 150b, as shown in FIGS. 4 and 5.

An interface 150c is between the second gate structure 110-2 and the source region 120S, and an interface 150d is between the second gate structure 110-2 and the drain region 120D-2. Further, a length of the interface 150c is different from a length of the interface 150d. In some embodiments, the interface 150c is between the source region 120S and a portion of a sidewall of the fifth portion 114-2, a sidewall of the fourth portion 112-2 and a portion of a sidewall of the sixth portion 116-2, as shown in FIG. 4. In such embodiments, the interface 150d is between the drain region 120D-2 and only a sidewall of the fourth portion 112-2 of the second gate structure 110-2. Further, the length of the interface 150c is greater than the length of the interface 150d, as shown in FIG. 4. In such embodiments, the drain regions 120D-1 and 120D-2 may have different shapes from the top view. Further, the drain region 120D-2 and the source region 120S may have similar shapes from the top view. In such embodiments, at least the source region 120S and the drain region 120D-1 are asymmetric to each other.

In some embodiments, the interface 150c is between the source region 120S and only a sidewall of the fourth portion 112-2 of the second gate structure 110-2 while the interface 150d is between the drain region 120D-2 and a portion of a sidewall of the fifth portion 114-2, a sidewall of the fourth portion 112-2 and a portion of a sidewall of the sixth portion 116-2. In such embodiments, the length of the interface 150c is less than the length of the interface 150d, as shown in FIG. 5. In such embodiments, the drain regions 120D-1 and 120D-2 may have similar shapes from the top view. Further, the source region 120S may be symmetrical about the axis A. In such embodiments, the source region 120S is asymmetrical to the drain regions 120D-1/120D-2.

As shown in FIGS. 4 and 5, in some embodiments, each of the second portion 114-1, the third portion 116-1, the fifth portion 114-2 and the sixth portion 116-2 partially overlaps the isolation structure 130.

Accordingly, the semiconductor structures 200a and 200b may efficiently mitigate the RTS noise issue due to the C-shaped gate structures 110-1, 110-2 and the asymmetric S/D configuration without violating design rule checking (DRC). As a result, feasibility and practicality of the semiconductor structures 200a and 200b are improved.

Referring to FIGS. 6 and 7, in some embodiments, the distance S between the first gate structure 110-1 and the second gate structure 110-2 may be zero. In other words, the first gate structure 110-1 and the second gate structure 110-2 are coupled to each other. In such embodiments, the source region 120S may be entirely surrounded or encircled by the first and the second gate structures 110-1 and 110-2. In some embodiments, the source region 120S and the drain regions 120D-1, 120D-2 may have shapes different from each other, as shown in FIG. 6. In some embodiments, the source region 120S may have a configuration different from those of the drain regions 120D-1 and 120D-2, while the drain regions 120D-1 and 120D-2 have similar configurations, as shown in FIG. 7.

In some embodiments, the length of the interface 150b is greater than the length of the interface 150a, the length of the interface 150c and the interface 150d, as shown in FIG. 6. In such embodiments, the length of the interface 150a, the length of the interface 150c and the length of the interface 150d may be similar, but the disclosure is not limited thereto. In some embodiments, the length of the interface 150a and the length of the interface 150c are less than the length of the interface 150b and the length of the interface 150d. In some embodiments, the length of the interface 150b and the length of the interface 150d are substantially the same. In some embodiments, the length of the interface 150a and the length of the interface 150c are substantially the same.

Accordingly, the semiconductor structures 200c and 200d may efficiently mitigate the RTS noise issue due to a combined C-shaped gate structures 110-1, 110-2 and the asymmetric S/D configuration without violating design rule checking, thus feasibility and practicality of the semiconductor structures 200c and 200d are improved.

FIGS. 8 to 11 are schematic drawings illustrating top views of semiconductor structures 300a. 300b. 300c and 300d according to aspects of the present disclosure in one or more embodiments. In some embodiments, FIGS. 8 to 11 may be referred to as schematic drawings illustrating layout structures, respectively. It should be noted that same elements in FIGS. 1A to 11 are indicated by same numerals, and can include a same material; thus, repeated detailed descriptions of such elements are omitted for brevity.

Figure 8:
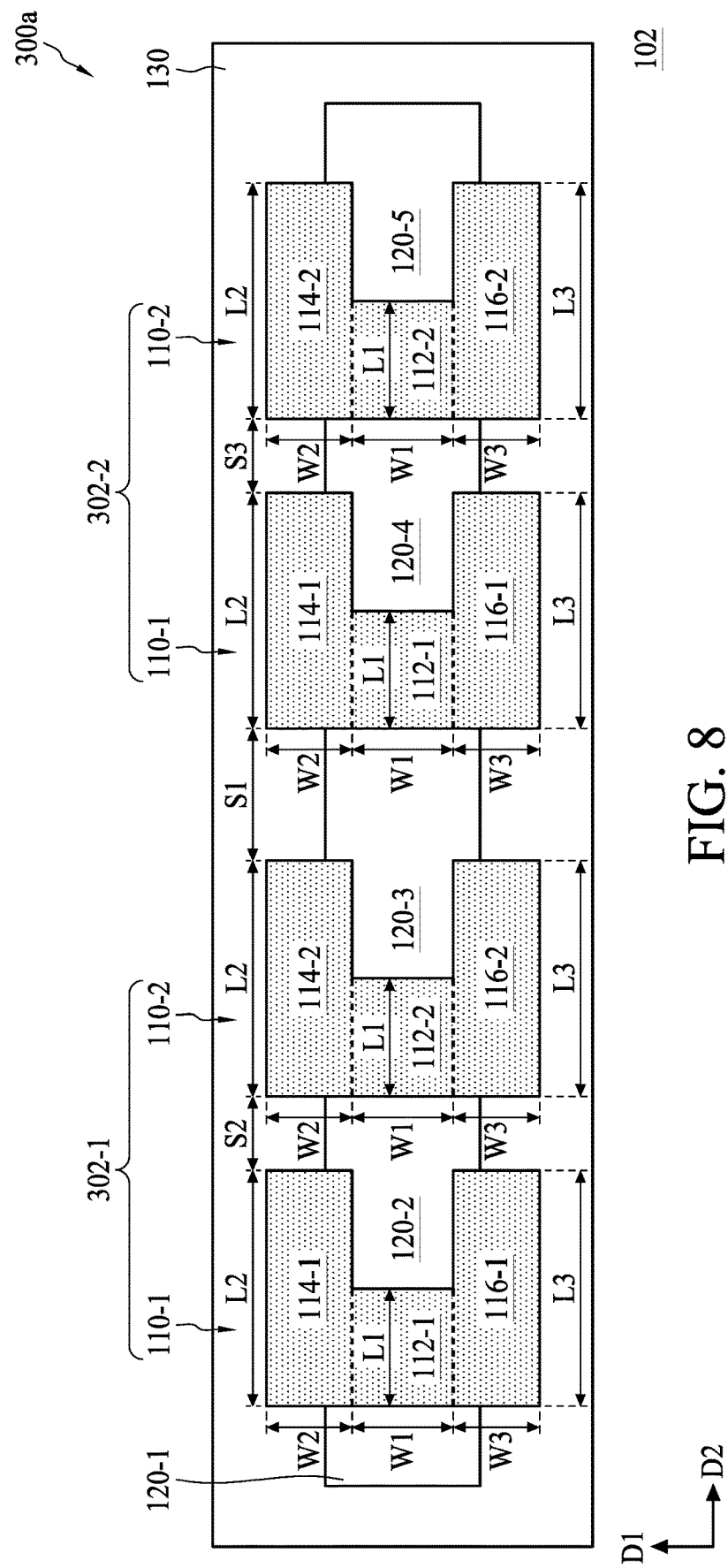
FIG. 8 is a schematic drawing illustrating a top view of a semiconductor structure according to aspects of the present disclosure in one or more embodiments.
Figure 9:
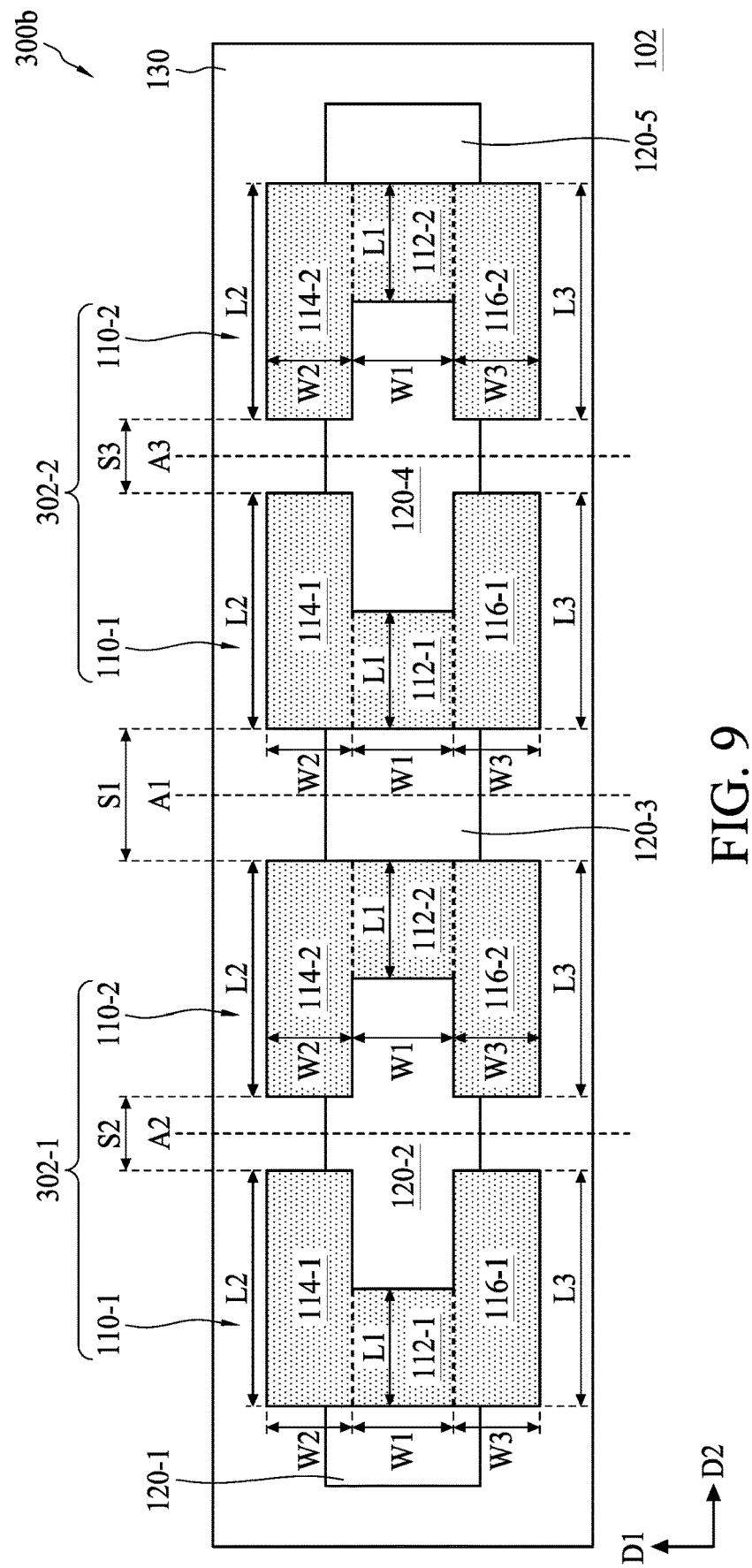
FIG. 9 is a schematic drawing illustrating a top view of a semiconductor structure according to aspects of the present disclosure in one or more embodiments.
Figure 10:
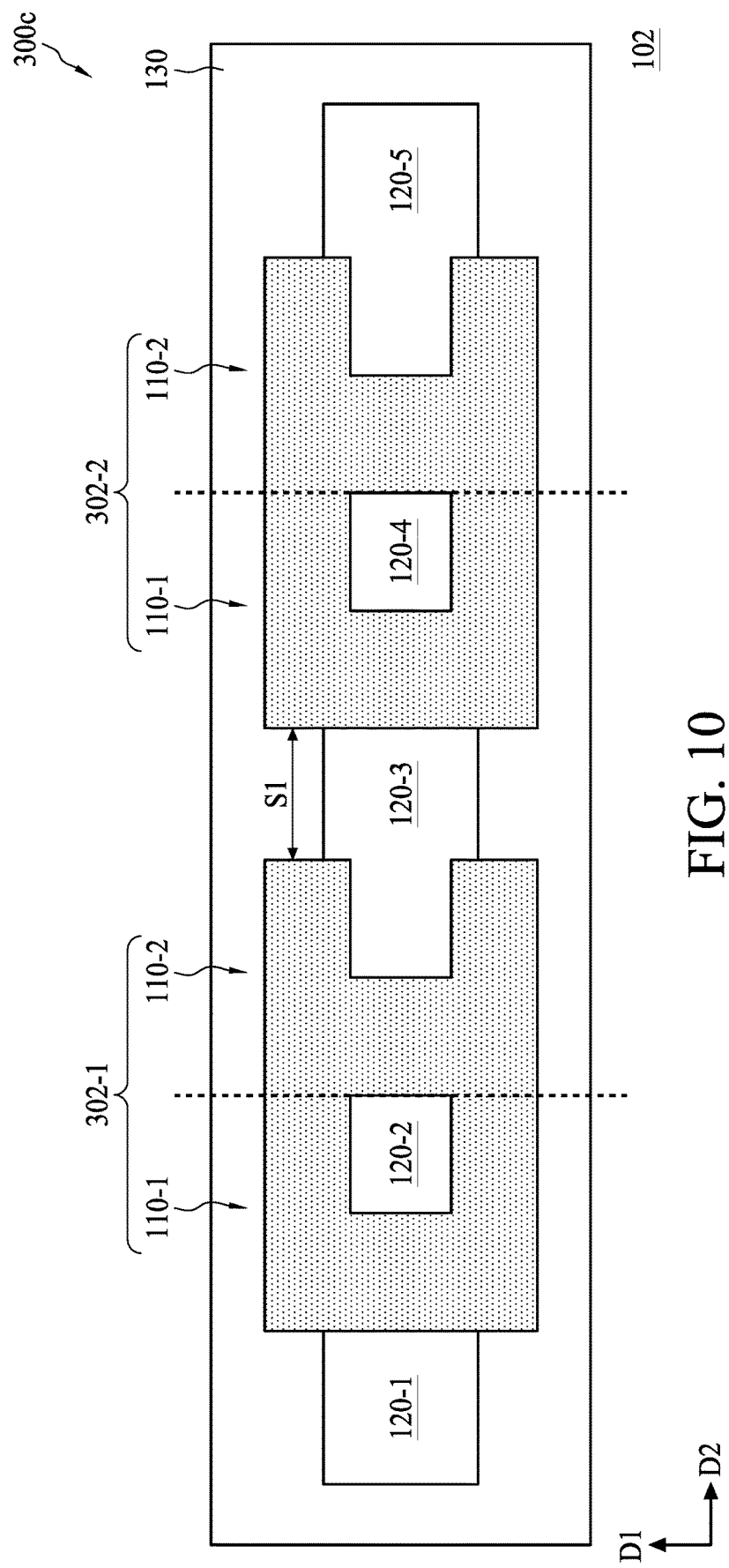
FIG. 10 is a schematic drawing illustrating a top view of a semiconductor structure according to aspects of the present disclosure in one or more embodiments.
Figure 11:
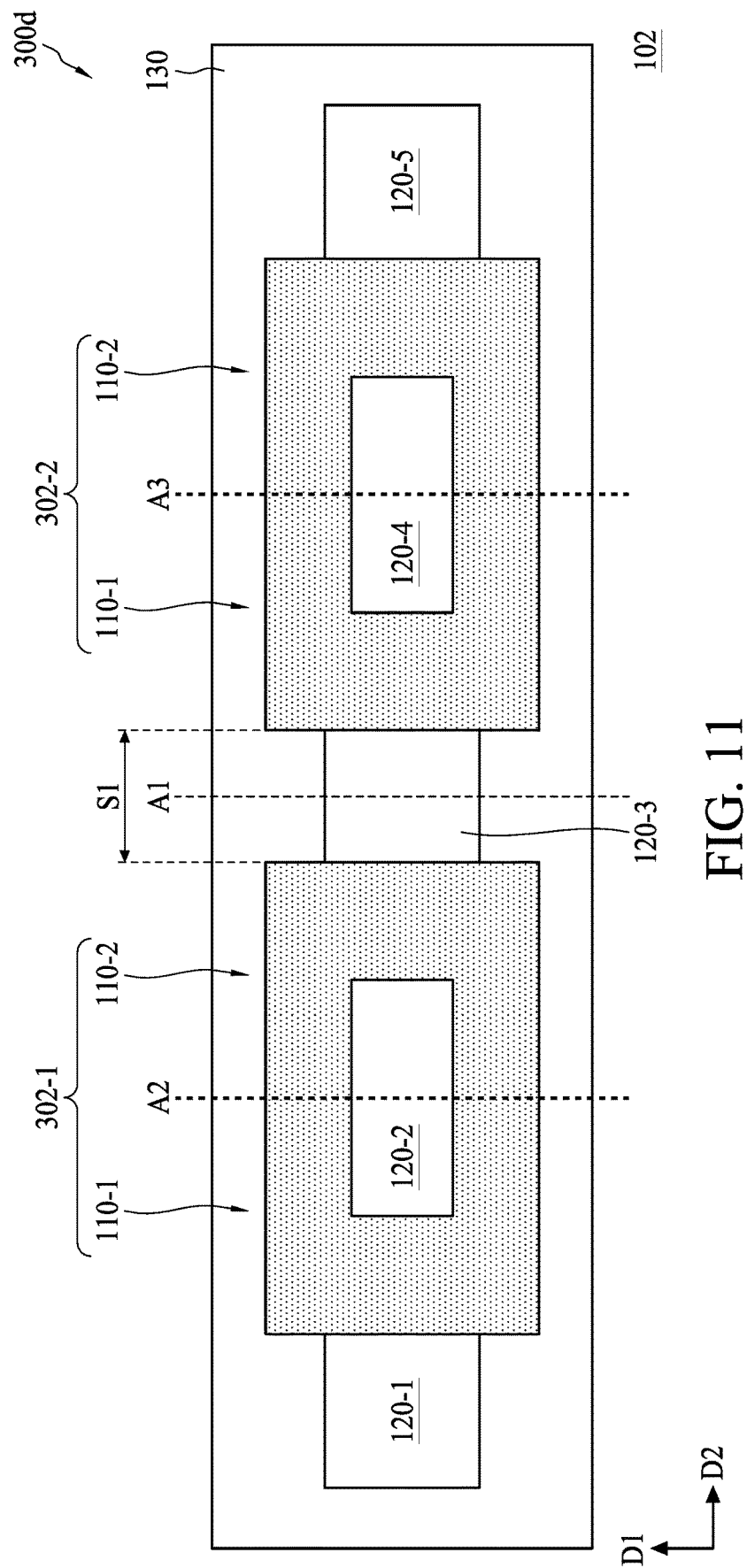
FIG. 11 is a schematic drawing illustrating a top view of a semiconductor structure according to aspects of the present disclosure in one or more embodiments.

In some embodiments, the gate structures 110-1 and 110-2 of the semiconductor structure 200a may be repeatedly disposed over a semiconductor substrate 102, as shown in FIG. 8. In some embodiments, the gate structures 110-1 and 110-2 of the semiconductor structure 200c may be repeatedly disposed over a semiconductor substrate 102, as shown in FIG. 10. In such embodiments, it may be said that the gate structure 110 of the semiconductor structure 100a is repeatedly disposed over the semiconductor substrate 102. In some embodiments, the gate structures 110-1 and 110-2 of the semiconductor structure 200b may be repeatedly disposed over the semiconductor substrate 102, as shown in FIG. 9. In some embodiments, the gate structures 110-1 and 110-2 of the semiconductor structure 200d may be repeatedly disposed over the semiconductor substrate 102, as shown in FIG. 11. In such embodiments, it may be said that the gate structure 110 of the semiconductor structure 100a and the gate structure 110 of the semiconductor structure 100b are periodically disposed over the semiconductor substrate 102. Accordingly, dimensions and configurations of each gate structure and arrangements and relationships between the gate structures may be similar to those described above; thus, repeated detailed descriptions of such elements are omitted for brevity.

Referring to FIGS. 8 to 11, in some embodiments, each of the semiconductor structures 300a, 300b. 300c and 300d may include a first set of gate structures 302-1 and a second set of gate structures 302-2. The first set of gate structures 302-1 may include two gate structures 110-1 and 110-2, and the second set of gate structures 302-2 may also include two gate structures 110-1 and 110-2. Each of the semiconductor structures 300a, 300b, 300c and 300d further includes a plurality of doped regions 120-1 to 120-5, and an isolation structure 130 surrounding the first set of gate structures 302-1, the second set of gate structures 302-2, and the doped regions 120-1 to 120-5.

As shown in FIGS. 8 to 11, the first set of gate structures 302-1 and the second set of gate structures 302-2 are separated by a distance S1. It should be noted that the distance S1 is defined as a least spacing distance between the first set of gate structures 302-1 and the second set of gate structures 302-2. For example, the distance S1 is defined as a distance between the second portion 114-2 of the gate structure 110-2 of the first set of gate structures 302-1 and the second portion 114-1 of the gate structure 110-1 of the second set of gate structures 302-2.

In some embodiments, the gate structure 110-1 and the gate structure 110-2 of the first set of gate structures 302-1 are separated from each other by a distance S2, while the gate structure 110-1 and the gate structure 110-2 of the second set of gate structures 302-2 are separated from each other by a distance S3. It should be noted that the distance S2 is defined as the least spacing distance between the gate structures 110-1 and 110-2 of the first set of gate structures 302-1, and the distance S3 is defined as the least spacing distance between the gate structures 110-1 and 110-2 of the second set of gate structures 302-2. For example, the distance S2 is defined as a distance between the second portion 114-1 of the gate structure 110-1 and the second portion 114-2 of the gate structure 110-2 in the first set of gate structures 302-1, while the distance S3 is defined as a distance between the second portion 114-1 of the gate structure 110-1 and the second portion 114-2 of the gate structure 110-2 of the second set of gate structures 302-2. In some embodiments, the distance S2 and the distance S3 are substantially the same, but the disclosure is not limited thereto. In some embodiments, the distance S1 is equal to or greater than the distance S2 and the distance S3, as shown in FIGS. 8 and 9. In some embodiments, the distance S2 and the distance S3 respectively may be equal to a minimum design rule. In such embodiments, the distance S1 may be equal to or greater than the minimum design rule.

In some embodiments, each of the gate structures 110-1 and 110-2 of the first and second sets of gate structures 302-1 and 302-2 has a C shape, as shown in FIGS. 8 and 10. In some embodiments, the first set of gate structures 302-1 and the second set of gate structures 302-2 are symmetrical about an axis A1, as shown in FIG. 9. Further, in some embodiments, the gate structure 110-1 and the gate structure 110-2 of the first set of gate structures 302-1 are symmetrical about an axis A2, while the gate structure 110-1 and the gate structure 110-2 of the second set of gate structures 302-2 are symmetrical about an axis A3, as shown in FIGS. 9 and 11. In some embodiments, the axis A1, A2 and A3 are parallel to each other, but the disclosure is not limited thereto.

In some embodiments, the doped region 120-3 is disposed between the first set of gate structures 302-1 and the second set of gate structures 302-2. The doped region 120-2 is disposed between the gate structure 110-1 and the gate structure 110-2 of the first set of gate structures 302-1. The doped region 120-4 is disposed between the gate structure 110-1 and the gate structure 110-2 of the second set of gate structures 302-2. Further, the doped region 120-1 is separated from the doped region 120-2 by the gate structure 110-1 of the first set of gate structures 302-1, and the doped region 120-5 is separated from the doped region 120-4 by the gate structure 110-2 of the second set of gate structures 302-2. In some embodiments, the doped region 120-1 may serve as a drain region, the doped region 120-2 may serve as a source region, the doped region 120-3 may serve as a drain region, the doped region 120-4 may serve as a source region, and the doped region 120-5 may serve as a drain region. In such embodiments, a shape of the source region 120-2 is defined by the gate structures 110-1 and 110-2 of the first set of gate structures 302-1, and a shape of the source region 120-4 is defined by the gate structures 110-1 and 110-2 of the second set of gate structures 302-2. Further, the drain region 120-3 is shared by the two sets of gate structures 302-1 and 302-2. In some alternative embodiments, the doped region 120-1 may serve as a source region, the doped region 120-2 may serve as a drain region, the doped region 120-3 may serve as a source region, the doped region 120-4 may serve as a drain region, and the doped region 120-5 may serve as a source region.

As shown in FIGS. 8 and 9, effective channel widths of each gate structure 110-1, 110-2 are different on the source side and the drain side. Further, each of the gate structures 110-1 and 110-2 partially overlaps the isolation structure 130. Accordingly, the semiconductor structures 300a and 300b may efficiently mitigate the RTS noise issue due to the C-shaped gate structures 110-1, 110-2 and the asymmetric S/D configuration without violating DRC; thus, feasibility and practicality of the semiconductor structures 300a and 300b are improved.

Referring to FIGS. 10 and 11, in some embodiments, the distance S2 between the first gate structure 110-1 and the second gate structure 110-2 of the first set of gate structures 302-1 may be zero. In some embodiments, the distance S2 between the first gate structure 110-1 and the second gate structure 110-2 of the second set of gate structures 302-2 may be zero. In other words, the gate structure 110-1 and the gate structure 110-2 of the first set of gate structures 302-1 are coupled to each other, and the gate structure 110-1 and the gate structure 110-2 of the second set of gate structures 302-2 are coupled to each other. In such embodiments, the doped region 120-2 may be entirely surrounded or encircled by the gate structures 110-1 and 110-2 of the first set of gate structures 302-1, and the doped region 120-4 may be entirely surrounded or encircled by the gate structures 110-1 and 110-2 of the second set of gate structures 302-2.

Accordingly, the semiconductor structures 300c and 300d may efficiently mitigate the RTS noise issue due to combined C-shaped gate structures 110-1, 110-2 and the asymmetric S/D configuration without violating design rule checking. As a result, feasibility and practicality of the semiconductor structures 300c and 300d are improved.

It should be noted that the gate structure 110 of the semiconductor structure 100a and/or 100b may be arranged to form a different semiconductor structure as shown in FIGS. 3 to 11, but the disclosure is not limited thereto. Similarly, the semiconductor structures 200a to 200d may be arranged to form different and greater semiconductor structures as shown in FIGS. 9 to 11, but the disclosure is not limited thereto. Further, the semiconductor structures 300a to 300d may be arranged to form different greater structures or integrated circuits, though not shown. Manufacturing of the semiconductor structures 100a and 100b, the semiconductor structures 200a to 200d, and the semiconductor structures 300a to 300d may be integrated into front-end-of-line (FEOL) operations.

In some embodiments, to form the transistor 100a and/or 100b, or to form the semiconductor structures 200a to 200d and 300a to 300d, a workpiece such as a semiconductor substrate 102 is provided or received. The semiconductor substrate 102 may include silicon or other semiconductor materials, and may be covered by an insulating layer, for example. For example, the semiconductor substrate may include single-silicon covered by a silicon oxide layer. In some embodiments, compound semiconductors such as GaAs, InP, Si/Ge or SiC may be used in place of silicon. For example, the semiconductor substrate 102 may include silicon-on-insulator (SOI) or a germanium-on-insulator (GOI) substrate. In some embodiments, the semiconductor substrate 102 may include other active components or circuits such as capacitors, diodes, resistors, inductors and/or other electrical components formed in FEOL operations.

In some embodiments, a hard mask may be formed over the semiconductor substrate 102 and patterned with a desired pattern for the isolation structure 130. In some embodiments, the hard mask may include silicon nitride, tetraethyl orthosilicate (TEOS) and silicon oxynitride, but the disclosure is not limited thereto. The hard mask may be a single-layered structure or a multi-layered structure, depending on different operation requirements. The patterned hard mask is used as a mask in an etching operation or other removal operation to remove a portion of the semiconductor substrate 102 to form at least a shallow trench for accommodating the isolation structure 130. In some embodiments, the etching operation may be a dry etch, but the disclosure is not limited thereto. In some embodiments, a polymer wet dipping may be performed after the forming of the shallow trench.

In some embodiments, a liner, such as a silicon oxide layer, is conformally formed to cover a bottom and sidewalls of the shallow trench. The shallow trench is then filled with an insulating material. In some embodiments, the insulating material may include silicon dioxide, silicon nitride, other insulating materials, or multiple layers or combinations thereof. A planarization operation such as chemical-mechanical polishing (CMP) is performed to remove superfluous insulating material, such that the isolation structure 130 (e.g., an STI structure) is formed in the semiconductor substrate 102. In some embodiments, a top surface of the isolation structure 130 and a top surface of the semiconductor substrate 102 may be aligned with each other (i.e., coplanar). In some embodiments, a portion of the isolation structure 130 may be removed using a dry etch or a wet etch, and a capping layer is formed to cover the isolation structure 130.

In some embodiments, another patterned hard mask may be formed over the semiconductor substrate 102 and an ion implant is performed to form an n-type well or a p-type well in the semiconductor substrate 102. Further, the n-type well or the p-type well may be surrounded by the isolation structure 130. In some embodiments, a phosphorous implantation may be performed to adjust a threshold voltage Vt, but the disclosure is not limited thereto.

A dielectric layer may be formed over the semiconductor substrate 102. The dielectric layer may include insulating material such as silicon oxide. A gate layer is formed on the dielectric layer. The gate layer may include a conductive material, a semiconductive material, or multiple layers or combinations thereof. In some embodiments, the polysilicon gate layer may be implanted in order to adjust the threshold voltage.

In some embodiments, the gate layer and the dielectric layer are patterned to form the gate structure 110 over the semiconductor substrate 102. As mentioned above, the gate structure 110 may include the first portion 112, the second portion 114 and the third portion 116. The first portion 112, the second portion 114 and the third portion 116 form a C-shaped gate structure. Further, each of the first portion 112 and the third portion 116 of the gate structure 110 partially overlaps the isolation structure 130.

In some embodiments, another implantation is performed to form the source region 120S and the drain region 120D. As mentioned above, the source region 120S and the drain region 120D may have an asymmetrical configuration.

Accordingly, the transistors 100a and 100b and the semiconductor structures 200a to 200d and the semiconductor structures 300a to 300d are able to be formed without extra manufacturing operations.

The present disclosure provides a transistor and a semiconductor structure to mitigate the RTS noise issue without violating design rule checking (DRC) and without requiring changes to manufacturing operations. In some embodiments, the provided transistor includes a C-shaped gate structure. In such embodiments, currents are confined and thus less current passes through the trapping sites at the interface between the STI and the MOSFET device. In some embodiments, the provided transistor includes an asymmetric source/drain structure. In such embodiments, current density in the source sidewalls is increased to suppress the trapping sites in the source sidewalls.

In some embodiments, a semiconductor structure is provided. The semiconductor structure includes a gate structure, a source region, a drain region, and an isolation structure. The gate structure includes a first portion, a second portion and a third portion. The first portion extends in a first direction, and the second portion and the third portion extend in a second direction different from the first direction. The first portion includes a first end and a second end opposite to the first end. The second portion is disposed at the first end, and the third portion is disposed at the second end. The source region and the drain region are separated from each other by the gate structure. The isolation structure surrounds the gate structure, the source region and the drain region. The first portion has a first sidewall parallel to the first direction, the second portion has a second sidewall parallel to the first direction, and the third portion has a third sidewall parallel to the first direction. In some embodiments, the first sidewall of the first portion, the second sidewall of the second portion and the third sidewall of the third portion are aligned with each other to form a straight line.

In some embodiments, a semiconductor structure is provided. The semiconductor structure includes a first gate structure, a second gate structure, a first doped region, a second doped region, a third doped region, and an isolation structure. The first gate structure includes a first portion, a second portion and a third portion. The first portion extends in a first direction, and the second and third portions extend in a second direction different from the first direction. The second portion and the third portion are disposed at opposite ends of the first portion. The second gate structure includes a fourth portion, a fifth portion and a sixth portion. The fourth portion extends in the first direction, and the fifth and sixth portions extend in the second direction. The fifth portion and the sixth portion are disposed at opposite ends of the fourth portion. The first doped region is disposed between the first gate structure and the second gate structure. The second doped region is separated from the first doped region by the first gate structure. The third doped region is separated from the first doped region by the second gate structure. The isolation structure surrounds the first gate structure, the second gate structure, the first doped region, the second doped region and the third doped region. The first portion has a first sidewall parallel to the first direction, the second portion has a second sidewall parallel to the first direction, and the third portion has a third sidewall parallel to the first direction. In some embodiments, the first sidewall of the first portion, the second sidewall of the second portion and the third sidewall of the third portion are aligned with each other to form a first straight line. The fourth portion has a fourth sidewall parallel to the first direction, the fifth portion has a fifth sidewall parallel to the first direction, and the sixth portion has a sixth sidewall parallel to the first direction. In some embodiments, the fourth sidewall of the fourth portion, the fifth sidewall of the fifth portion and the sixth sidewall of the sixth portion are aligned with each other to form a second straight line parallel to the first straight line.

In some embodiments, a semiconductor structure is provided. The semiconductor structure includes a first set of gate structures, a second set of gate structures, a plurality of doped regions, and an isolation structure. The first set of gate structures includes a first gate structure and a second gate structure. The second set of gate structures includes a third gate structure and a fourth gate structure. The isolation structure surrounds the first set of gate structures, the second set of gate structures, and the doped regions. The first set of gate structures and the second set of gate structures are separated by a first distance. The first gate structure and the second gate structure of the first set of gate structures are separated from each other by a second distance. The third gate structure and the fourth gate structure of the second set of gate structures are separated from each other by a third distance. In some embodiments, the first distance is equal to or greater than the second distance and the third distance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
    a first gate structure comprising:
        a first portion extending in a first direction;
        a second portion extending in a second direction different from the first direction; and
        a third portion extending in the second direction, wherein the second portion and the third portion are disposed at opposite ends of the first portion;
    a second gate structure, wherein the second gate structure comprises:
        a fourth portion extending in the first direction;
        a fifth portion extending in the second direction; and
        a sixth portion extending in the second direction, wherein the fifth portion and the sixth portion are disposed at opposite ends of the fourth portion;
    a source region surrounded by the first gate structure and the second gate structure;
    a first drain region separated from the source region by the first gate structure;
    a second drain region separated from the source region by the second gate structure; and
    an isolation structure surrounding the first gate structure, the second gate structure, the source region, the first drain region and the second drain region,
    wherein the second portion of the first gate structure is in direct contact with the fifth portion of the second gate structure, and the third portion of the first gate structure is in direct contact with the sixth portion of the second gate structure,
    wherein the first portion has a first sidewall parallel to the first direction, the second portion has a second sidewall parallel to the first direction, the third portion has a third sidewall parallel to the first direction, and the first sidewall of the first portion, the second sidewall of the second portion and the third sidewall of the third portion are aligned with each other to form a straight line,
    wherein the fourth portion of the second gate structure has a fourth sidewall parallel to the first direction, the fifth portion of the second gate structure has a fifth sidewall parallel to the first direction, the sixth portion of the second gate structure has a sixth sidewall parallel to the first direction, and the fourth sidewall of the fourth portion is offset from the fifth sidewall of the fifth portion and the sixth sidewall of the sixth portion, wherein a shape of the first drain region and a shape of the second drain region are different from each other from a plan view.

2. The semiconductor structure of claim 1, wherein the first portion has a first length, the second portion has a second length, the third portion has a third length, and the first length is less than the second length and less than the third length.

3. The semiconductor structure of claim 2, wherein the second length and the first length have a first ratio, the first ratio is between approximately 1.1 and approximately 3, the third length and the first length have a second ratio, and the second ratio is between approximately 1.1 and approximately 3.

4. The semiconductor structure of claim 1, wherein a width of the second portion and a width of the first portion have a third ratio, the third ratio is between approximately 0.1 and approximately 3, a width of the third portion and the width of the first portion have a fourth ratio, and the fourth ratio is between approximately 0.1 and approximately 3.

5. The semiconductor structure of claim 1, wherein a first interface is between the first gate structure and the first drain region, a second interface is between the first gate structure and the source region, and a length of the first interface is different from a length of the second interface.

6. The semiconductor structure of claim 1, wherein each of the second portion and the third portion partially overlaps the isolation structure.

7. A semiconductor structure comprising:
   a first gate structure, wherein the first gate structure comprises:
      a first portion extending in a first direction;
      a second portion extending in a second direction different from the first direction; and
      a third portion extending in the second direction, wherein the second portion and the third portion are disposed at opposite ends of the first portion;
   a second gate structure, wherein the second gate structure comprises:
      a fourth portion extending in the first direction;
      a fifth portion extending in the second direction; and
      a sixth portion extending in the second direction, wherein the fifth portion and the sixth portion are disposed at opposite ends of the fourth portion;
   a first doped region disposed between the first gate structure and the second gate structure;
   a second doped region separated from the first doped region by the first gate structure;
   a third doped region separated from the first doped region by the second gate structure; and
   an isolation structure surrounding the first gate structure, the second gate structure, the first doped region, the second doped region and the third doped region,
   wherein the first gate structure is in direct contact with the second gate structure to form a ring pattern surrounding the first doped region,
   wherein a shape of the second doped region and a shape of the third doped region are different from each other from a plan view.

8. The semiconductor structure of claim 7, wherein a first interface is between the first doped region and the first gate structure, a second interface is between the second doped region and the first gate structure, and a length of the first interface is less than a length of the second interface.

9. The semiconductor structure of claim 8, wherein a third interface is between the first doped region and the second gate structure, a fourth interface is between the third doped region and the second gate structure, and a length of the third interface is equal to a length of the fourth interface.

10. A semiconductor structure, comprising:
    a first set of gate structures comprising a first gate structure and a second gate structure, wherein the first gate structure is in direct contact with the second gate structure;
    a second set of gate structures separated from the first set of gate structures and comprising a third gate structure and a fourth gate structure, wherein the third gate structure is in direct contact with the fourth gate structure;
    a plurality of doped regions, wherein the plurality of doped regions comprise:
       a first doped region disposed between the first set of gate structures and the second set of gate structures;
       a second doped region surrounded by the first gate structure and the second gate structure of the first set of gate structures, and a third doped region surrounded by the third gate structure and the fourth gate structure of the second set of gate structure; and
       a fourth doped region and a fifth doped region separated from each other by the first set of gate structures, the second doped region, the first doped region, the third doped region and the second set of gate structures; and
    an isolation structure surrounding the first set of gate structures, the second set of gate structures, and the plurality of doped regions,
    wherein the first set of gate structures and the second set of gate structures are separated by a first distance,
    wherein a shape of the fourth doped region and a shape of the fifth doped region are different from each other from a plan view.

11. The semiconductor structure of claim 10, wherein each of the first gate structure, the second gate structure, the third gate structure, and the fourth gate structure has a C shape.

12. The semiconductor structure of claim 1, wherein a width of the fourth portion of the second gate structure is equal to a width of the first portion of the first gate structure.

13. The semiconductor structure of claim 1, wherein a length of the fifth portion of the second gate structure is equal to a length of the second portion of the first gate structure, and a length of the sixth portion of the second gate structure is equal to a length of the third portion of the first gate structure.

14. The semiconductor structure of claim 10, wherein the second doped region and the third doped region comprise a same shape from the plan view.

15. The semiconductor structure of claim 10, wherein a shape of the first doped region and the shape of the fourth doped region are different shapes from the plan view.

16. The semiconductor structure of claim 15, wherein the shape of the first doped region are different from a shape of the second doped region and a shape of the third doped region from the plan view.

17. The semiconductor structure of claim 10, wherein the shape of the fifth doped region is different from a shape of the third doped region from the plan view.

18. The semiconductor structure of claim 10, wherein the first distance is equal to or greater than a minimum design rule.

19. The semiconductor structure of claim 18, wherein the first distance is less than a length of the first doped region.

20. The semiconductor structure of claim 10, wherein each of the first set of gate structures and the second set of gate structures has an asymmetric pattern.

* * * * *